(12) United States Patent
Nakao

(10) Patent No.: US 11,914,202 B2
(45) Date of Patent: Feb. 27, 2024

(54) OPTICAL MODULE

(71) Applicant: Fujitsu Optical Components Limited, Kawasaki (JP)

(72) Inventor: Takuya Nakao, Sapporo (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 317 days.

(21) Appl. No.: 17/176,769

(22) Filed: Feb. 16, 2021

(65) Prior Publication Data
US 2021/0333492 A1 Oct. 28, 2021

(30) Foreign Application Priority Data

Apr. 24, 2020 (JP) ................. 2020-077842

(51) Int. Cl.
*G02B 6/42* (2006.01)
*H05K 1/14* (2006.01)

(52) U.S. Cl.
CPC .......... *G02B 6/4242* (2013.01); *G02B 6/4244* (2013.01); *G02B 6/4281* (2013.01); *H05K 1/147* (2013.01); *H05K 2201/10121* (2013.01); *H05K 2201/10431* (2013.01)

(58) Field of Classification Search
CPC .. G02B 6/4242; G02B 6/4244; G02B 6/4281; H05K 1/147; H05K 2201/10121; H05K 2201/10431

See application file for complete search history.

(56) References Cited

U.S. PATENT DOCUMENTS 5,050,154 A * 9/1991 Shimozawa ............. G11B 7/12
369/120
6,618,267 B1 9/2003 Dalal et al.
(Continued)

FOREIGN PATENT DOCUMENTS

CN 103995324 A 8/2014
CN 106059672 A 10/2016
(Continued)

OTHER PUBLICATIONS

First Notification of Office Action dated Jun. 2, 2022 in corresponding Chinese Patent Application No. 202110183636.4 (8 pages) (9 pages English Translation).

(Continued)

Primary Examiner — Georgia Y Epps
Assistant Examiner — Don J Williams
(74) Attorney, Agent, or Firm — STASS & HALSEY LLP

(57) ABSTRACT

The optical module includes a housing, a lid that closes an opening of the housing, an optical component arranged inside the housing, and a printed circuit board arranged on a front surface of the lid outside the housing so as to be used as a board on which a control circuit that controls the optical component is mounted. The optical module further includes a side electrode that is provided on a side surface of the housing and configured to be electrically connected to an electrode of the optical component; and a flexible substrate that provides electrical connection between the side electrode and an electrode of the control circuit. The optical module can be miniaturized by integrating the optical component and the control circuit.

7 Claims, 7 Drawing Sheets

(56) References Cited

U.S. PATENT DOCUMENTS

| | | | |
|---|---|---|---|
| 6,832,049 B1* | 12/2004 | Kuroda | G02B 6/4277 |
| | | | 398/138 |
| 2007/0053639 A1 | 3/2007 | Aruga | |
| 2012/0087136 A1 | 4/2012 | Kuwahara | |
| 2015/0341118 A1 | 11/2015 | Wang et al. | |
| 2016/0308329 A1 | 10/2016 | Ishii et al. | |
| 2020/0026974 A1* | 1/2020 | Chuang | G06K 19/07749 |

FOREIGN PATENT DOCUMENTS

| | | |
|---|---|---|
| CN | 107390331 A | 11/2017 |
| JP | 2001-036003 A | 2/2001 |
| JP | 2007-071980 | 3/2007 |
| JP | 2007-311709 A | 11/2007 |
| JP | 2012-084614 | 4/2012 |
| JP | 2013-207161 A | 10/2013 |

OTHER PUBLICATIONS $2^{nd}$ Notification of Office Action dated Feb. 11, 2023 in related Chinese Patent Application No. 202110183636.4 (7 pages) (10 pages English Translation).

Japanese Office Action issued in corresponding Japanese Application No. 2020-077842 dated Sep. 26, 2023.

* cited by examiner

OPTICAL MODULE

CROSS-REFERENCE TO RELATED APPLICATION

This application is based upon and claims the benefit of priority of the prior Japanese Patent Application No. 2020-077842, filed on Apr. 24, 2020, the entire contents of which are incorporated herein by reference.

FIELD

The embodiments discussed herein are related to an optical module.

BACKGROUND

Conventional modules use a structure in which a main circuit is arranged inside a resin case and a power board is arranged outside the resin case and fixed. Furthermore, a typical optical module uses a configuration in which an optical component and a control circuit that controls the optical components are arranged in parallel. Japanese Laid-open Patent Publication No. 2001-36003

Unfortunately, however, due to this configuration in which the optical component and the control circuit are arranged in parallel, the optical module needs a space for arranging the optical component and the control component in parallel, making it difficult to miniaturize the entire module.

SUMMARY

According to an aspect of an embodiment, an optical module includes a housing, a lid, a printed circuit board, a side electrode and a flexible substrate. The lid closes an opening of the housing. The optical component is arranged inside the housing. The printed circuit board is arranged on a front surface of the lid outside the housing. A control circuit that controls the optical component is mounted on the printed circuit board. The side electrode is provided on a side surface of the housing and is electrically connected to an electrode of the optical component. The flexible substrate provides electrical connection between the side electrodes and an electrode of the control circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The present disclosed technique is not limited to the present embodiments. Moreover, it is possible to combine each of the embodiments appropriately in a scope that would not conflict with each other.

[a] First Embodiment

Figure 1:
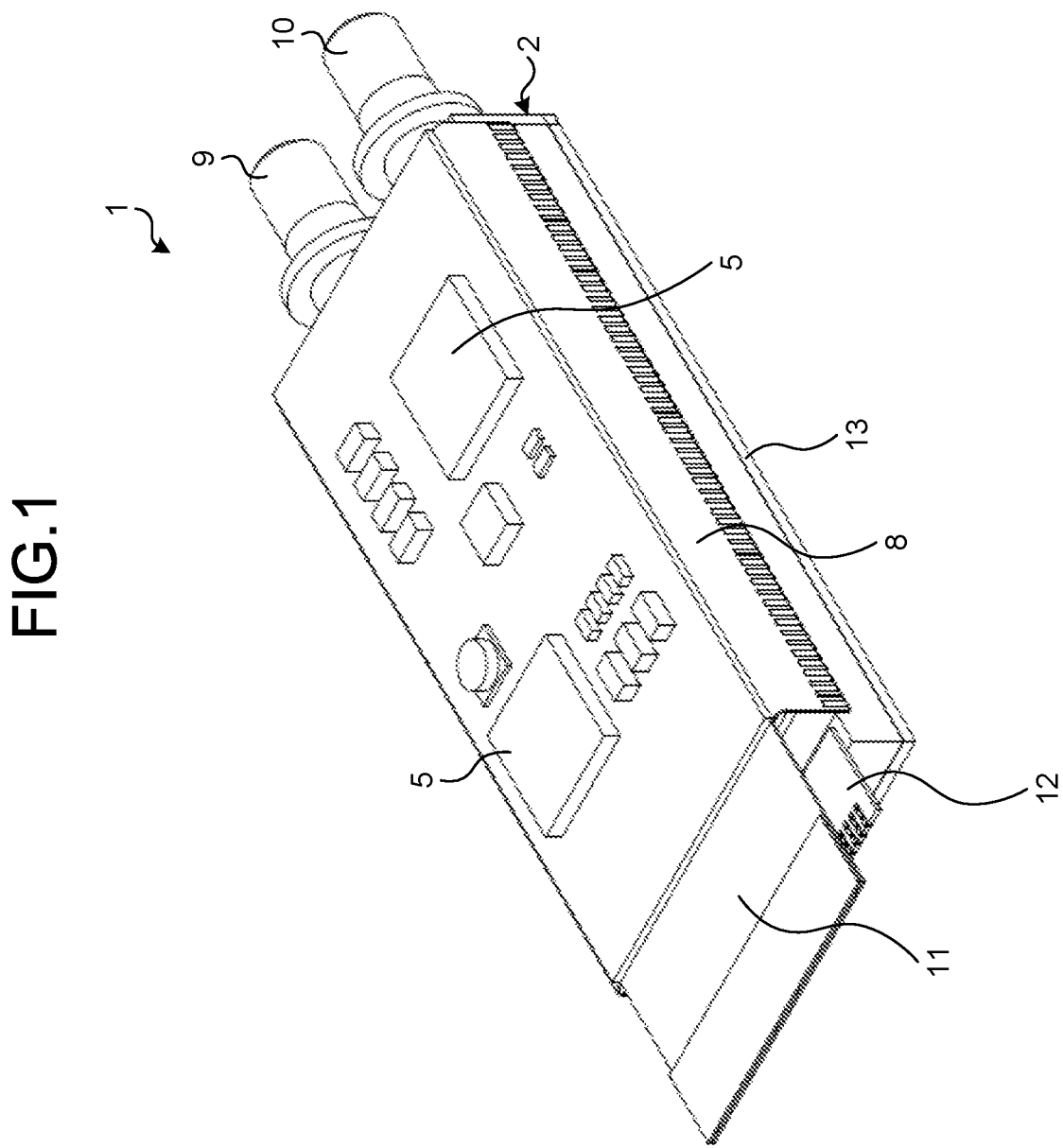
FIG. 1 is a perspective view illustrating an example of an optical module of a first embodiment.
Figure 2:
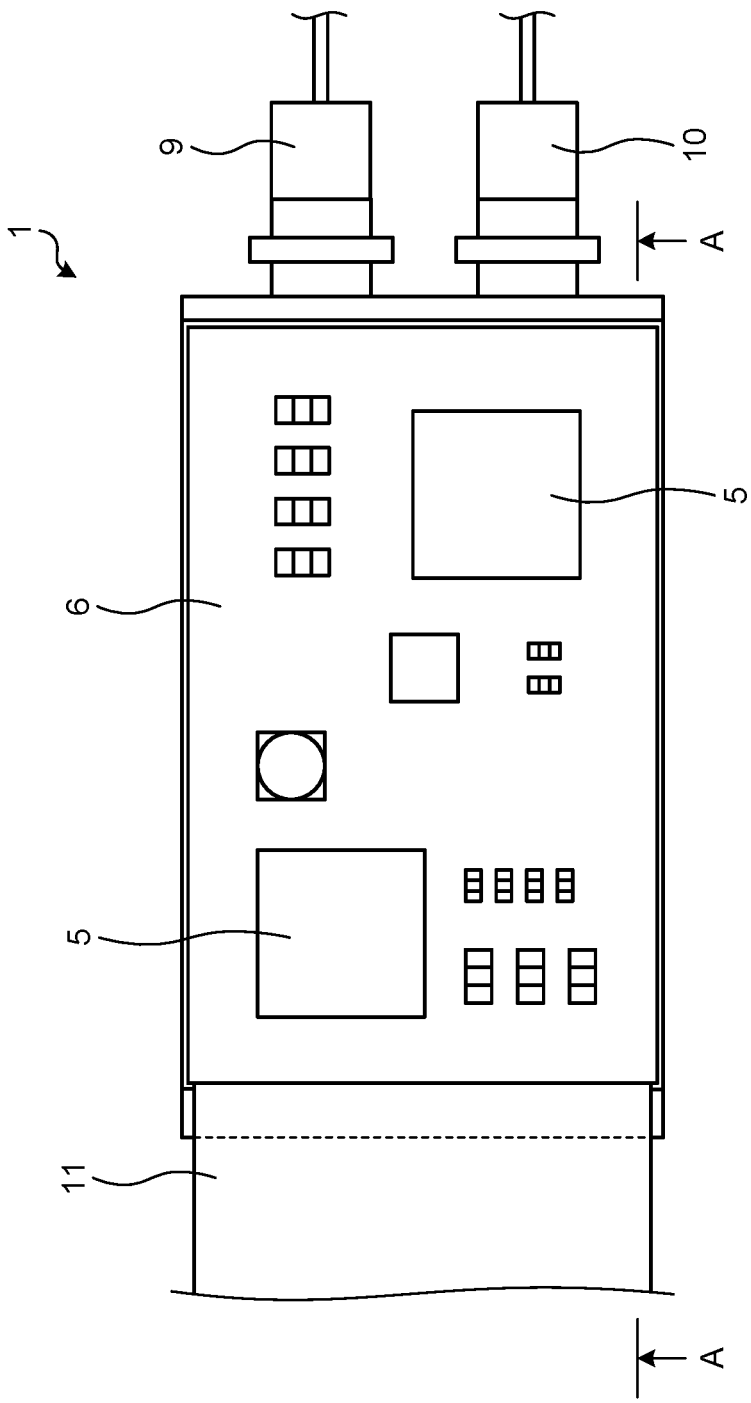
FIG. 2 is a plan view illustrating an example of an optical module.
Figure 3:
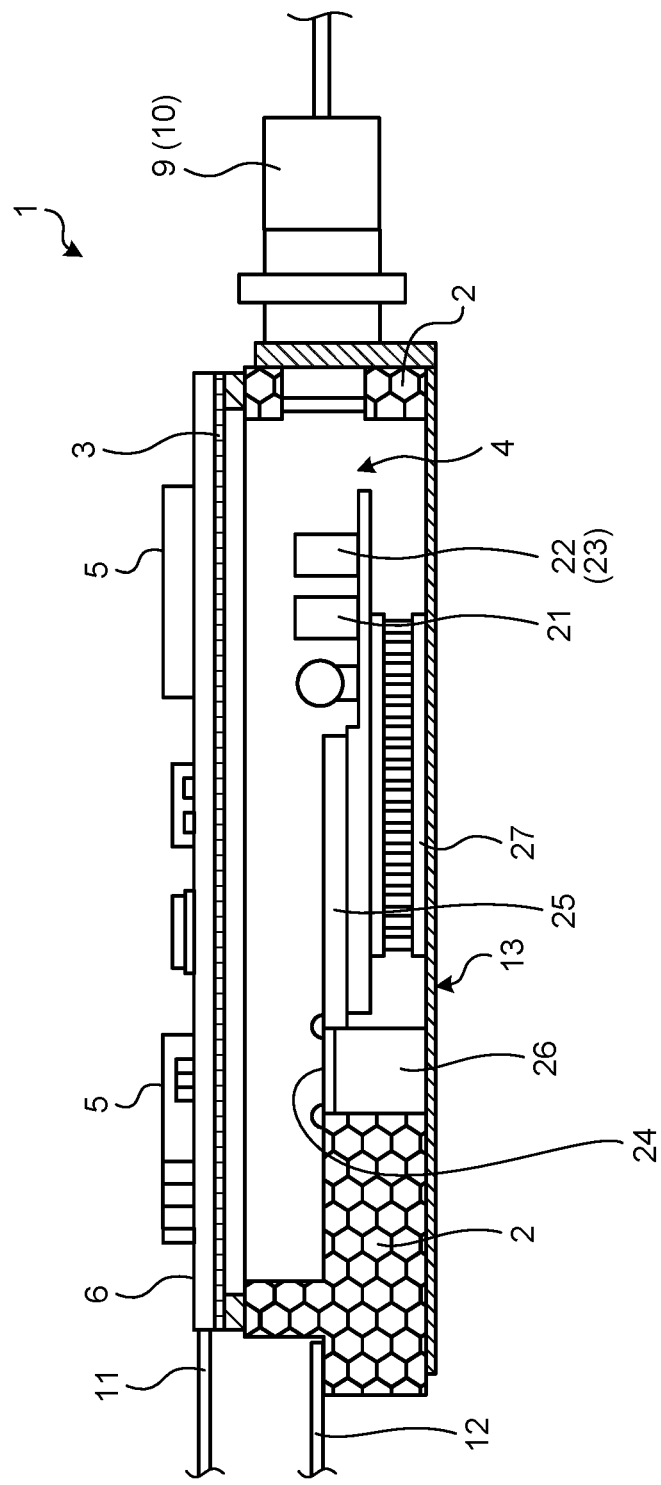
FIG. 3 is a partial sectional view taken along line A-A of FIG. 2.
Figure 4:
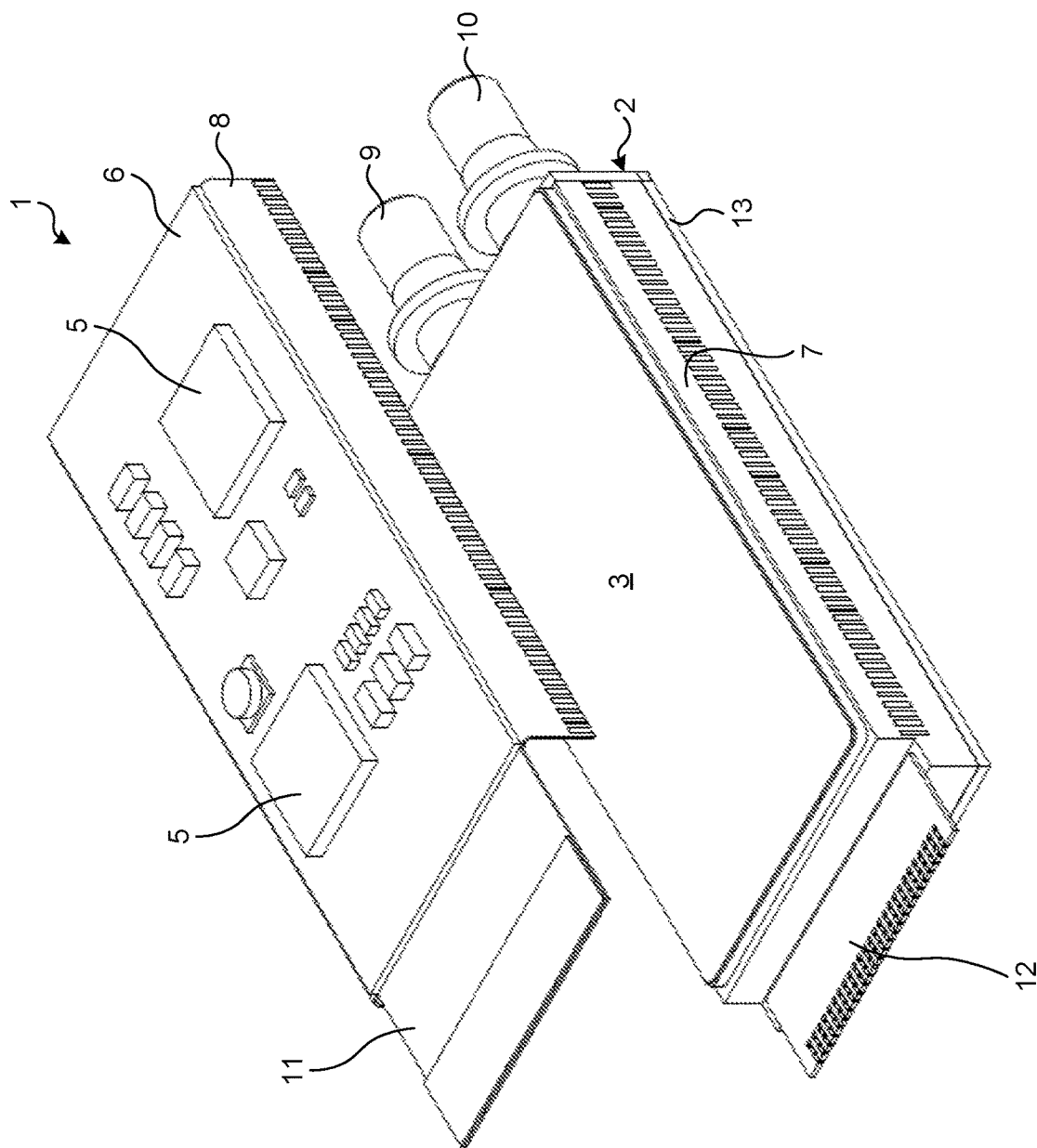
FIG. 4 is an exploded perspective view illustrating an example of an optical module.

FIG. 1 is a perspective view illustrating an example of an optical module 1 of a first embodiment. FIG. 2 is a plan view illustrating an example of the optical module 1. FIG. 3 is a partial sectional view taken along line A-A of FIG. 2. FIG. 4 is an exploded perspective view illustrating an example of the optical module 1.

The optical module 1 illustrated in FIGS. 1 to 4 includes a housing 2, a lid 3 that closes an opening of the housing 2, an optical component 4 arranged inside the housing 2, and a printed circuit board 6 arranged on a front surface of the lid 3 outside the housing 2 so as to be used as a board on which a control circuit 5 that controls the optical component 4 is mounted. The optical module 1 further includes: a side electrode 7 that is provided on a side surface of the housing 2 and configured to be electrically connected to an electrode of the optical component 4; and a flexible substrate 8 that provides electrical connection between the side electrode 7 and an electrode of the control circuit 5. Furthermore, the optical module 1 includes, on one end side, an optical output unit 9 and an optical input unit 10, and includes, on the other side, a low-speed interface 11 and a high-speed interface 12.

The housing 2 is formed of a material such as ceramic, for example, and has a structure to house the optical component 4. The lid 3 is formed of a metal material such as a Fe—Ni—Co alloy. The lid 3 is formed of a material that blocks electrical noise. When the opening of the housing 2 is closed with the lid 3, the internal space is hermetically sealed in the structure of the housing 2.

The optical component 4 is a component needed for coherent optical communication. The optical component 4 includes light source related components 21 (22, 23), an optical waveguide 25 including an optical transmission circuit and an optical reception circuit, a high-speed LSI 24, a heat sink block 26, and a Peltier element 27. The light source of the light source related components 21 (22, 23) is a laser diode that emits an optical signal. The optical transmission circuit is connected to the optical output unit 9 and outputs an optical signal (first signal) to the optical output unit 9 using the optical signal from the light source. The optical reception circuit is connected to the optical input unit 10 and receives an optical signal (second signal) input from the optical input unit 10 using the optical signal from the light source. The high-speed LSI 24 is connected between the light source related component 22 and the high-speed interface 12, and executes signal processing regarding an optical signal from the high-speed interface 12 to the light source related component 22. Furthermore, the high-speed LSI 24 is connected between the light source related component 23 and the high-speed interface 12, and executes signal processing of an optical signal from the light source related component 23 to the high-speed interface 12.

The optical waveguide 25 is a waveguide that connects the high-speed LSI 24 and the light source related component 23 and transmits an optical signal from the light source related component 23 to the high-speed LSI 24. Furthermore, the optical waveguide 25 is a waveguide that connects between the high-speed LSI 24 and the light source related component 22 and transmits an optical signal from the high-speed LSI 24 to the light source related component 22. The heat sink block 26 is a cooling component that cools the high-speed LSI 24. The Peltier element 27 is a cooling component that cools the light source related components 21 (22, 23).

The printed circuit board 6 is a substrate on which the control circuit 5 is mounted. The control circuit 5 controls the optical component 4. The control circuit 5 has a function of performing stability control of optical outputs from the light source related components 21 (22, 23) included in the optical component 4, a function of controlling the temperature of the Peltier element 27, or the like. The control circuit 5 is connected to the low-speed interface 11 that controls a communication interface with a CPU (not illustrated). The printed circuit board 6 is arranged on the lid 3 that closes the opening of the housing 2, whereby the printed circuit board 6 and the housing 2 are stacked via the lid 3. This makes it possible to have the outer size of the printed circuit board 6 substantially equal to the outer size of the housing 2, with the dimension up to 22 mm×14 mm in design.

Furthermore, the side electrode 7 and the flexible substrate 8 are to be electrically connected using an anisotropic conductive adhesive. Using the flexible substrate 8, electrical connection is provided between the side electrode 7 on the left and right sides of the housing 2 and the electrodes on the left and right sides of the control circuit 5. At this time, in a case where the side electrode 7 has 60 terminals on one side of the housing 2, for example, it would be possible to achieve electrical connection using 120 terminals on the side electrode 7 on either side of the housing 2. On a bottom surface of the housing 2, a heat dissipation plate 13 formed of copper tungsten is attached, for example.

The optical component 4 is hermetically sealed inside the housing 2, while the printed circuit board 6 on which the control circuit 5 is mounted is arranged on the front surface of the lid 3 that closes the opening of the housing 2.

The optical module 1 of the first embodiment has a structure in which the optical component 4 is arranged inside the housing 2, with the optical component 4 hermetically sealed inside the housing 2 by closing the opening of the housing 2 using the lid 3. Furthermore, the optical module 1 has a configuration in which the printed circuit board 6 on which the control circuit 5 is mounted is arranged on the front surface of the lid 3, and the flexible substrate 8 is used to electrically connect between the side electrode 7 provided on the side surface of the housing 2 and configured to be electrically connected to the electrode of the optical component 4 and the electrode of the control circuit 5. This results in a configuration of vertically stacking the optical component 4 and the control circuit 5 via the lid 3, thereby achieving miniaturization of the entire optical module 1.

Furthermore, with the structure in which the optical component 4 is hermetically sealed inside the housing 2 by using the lid 3, it is possible to suppress the influence of foreign matter such as flux and the outgassing from the control circuit 5 on the optical component 4 in the manufacturing process. Furthermore, since the control circuit 5 is provided outside the housing 2, the control circuit 5 can be easily repaired or replaced even at the failure of the control circuit 5.

Moreover, since the control circuit 5 is arranged on the lid 3 side of the housing 2, it is possible to achieve a simple heat dissipation structure without being influence by the heat from the optical component 4.

The structure employed is a structure of hermetically sealing the optical component 4 inside the housing 2 using a metal lid 3, which is a structure to shield between the control circuit 5 and the optical component 4 by the lid 3. As a result, the lid 3 blocks high-frequency noise generated from the control circuit 5, which will also suppress a situation in which the high-frequency noise generated from the control circuit 5 interferes with the optical component 4 inside the housing 2, leading to suppression of degradation of signal quality.

Furthermore, due to the structure in which the optical component 4 inside the housing 2, the high-speed LSI 24 in particular, and the control circuit 5 outside the housing 2 are stacked via the lid 3, it is possible to obtain a circuit mounting area substantially equal to the area of the housing 2. This results in acquisition of higher degree of freedom in circuit design. This would expand a component selection range and also enables application of low-cost components, leading to overall cost reduction regarding the optical module 1.

With the configuration of separating the heat dissipation surface of the optical component 4 from the heat dissipation surface of the control circuit 5, it is possible to facilitate the heat dissipation design. Furthermore, the heat of the optical component 4 inside the housing 2 can be dissipated from the heat dissipation plate 13 on the bottom surface of the housing 2, while the heat of the control circuit 5 can be dissipated from the top surface of the control circuit 5.

Furthermore, the heat of the high-speed LSI 24 in the optical component 4 is dissipated by the heat sink block 26, while the heat of the light source related components 21 (22, 23) and the optical waveguide 25 is dissipated by the Peltier element 27, for example. This result in avoidance of the influence of heat on the optical component 4.

The optical module 1 of the first embodiment uses a structure in which the optical component 4 arranged in the housing 2 is hermetically sealed by using the lid 3. However, the structure is not limited to the hermetically sealed structure and structures other than the heretical structure may be used, which means the structure may be changed as appropriate.

The above is an exemplary case where the lid 3 is formed of metal. However, the material is not limited to metal, and it is also possible to use a radio wave absorber formed of a material that blocks high-frequency noise generated in the control circuit 5, which means the material of the lid 3 may be changed as appropriate.

Example of the material of the lid 3 may include Kovar (Fe-29Ni-17Co), stainless steel (SUS304), or 42 alloy (Fe-42Ni). Furthermore, examples of the material of the radio wave absorber may include alumina ceramics (Al2O3) containing carbon, ferrite ceramics (Fe2O3), or the like. The material of the radio wave absorber may be a hard material (excluding a sheet-like or film-like deformable material) that can be used in place of the lid 3 of the housing 2.

The optical module 1 of the first embodiment is an exemplary case where the control circuit 5 is mounted on one side of the printed circuit board 6. However, the optical module 1 is also applicable to a case in which the control circuit 5 is mounted on both sides of the printed circuit board 6. An embodiment of this use case will be described below as a second embodiment. A same reference sign will be given to a configuration that is same as the optical module 1 in the first embodiment, and description of the duplicate configuration and operation will be omitted.

[b] Second Embodiment

Figure 5:
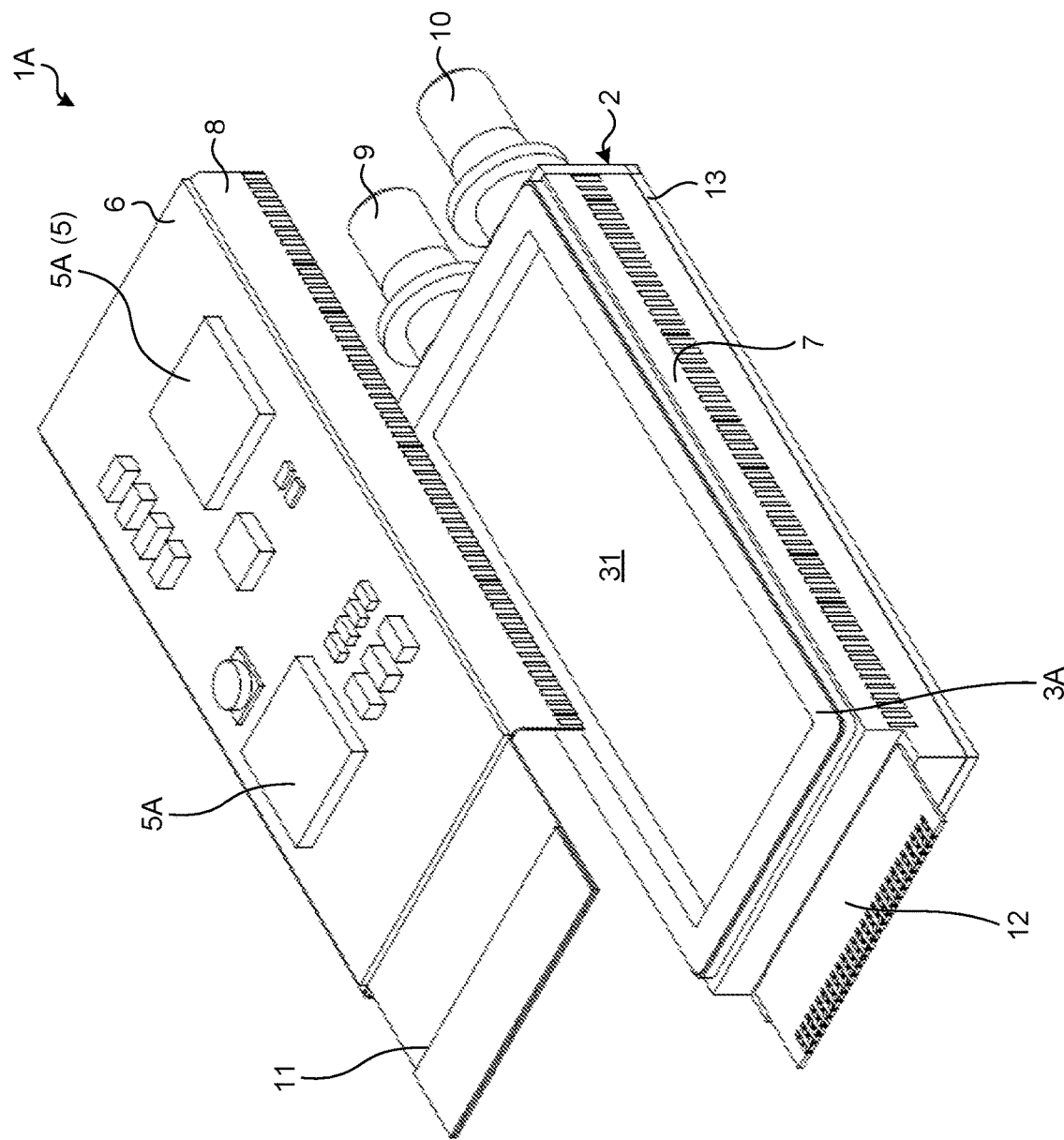
FIG. 5 is an exploded perspective view illustrating an example of an optical module of a second embodiment.
Figure 6:
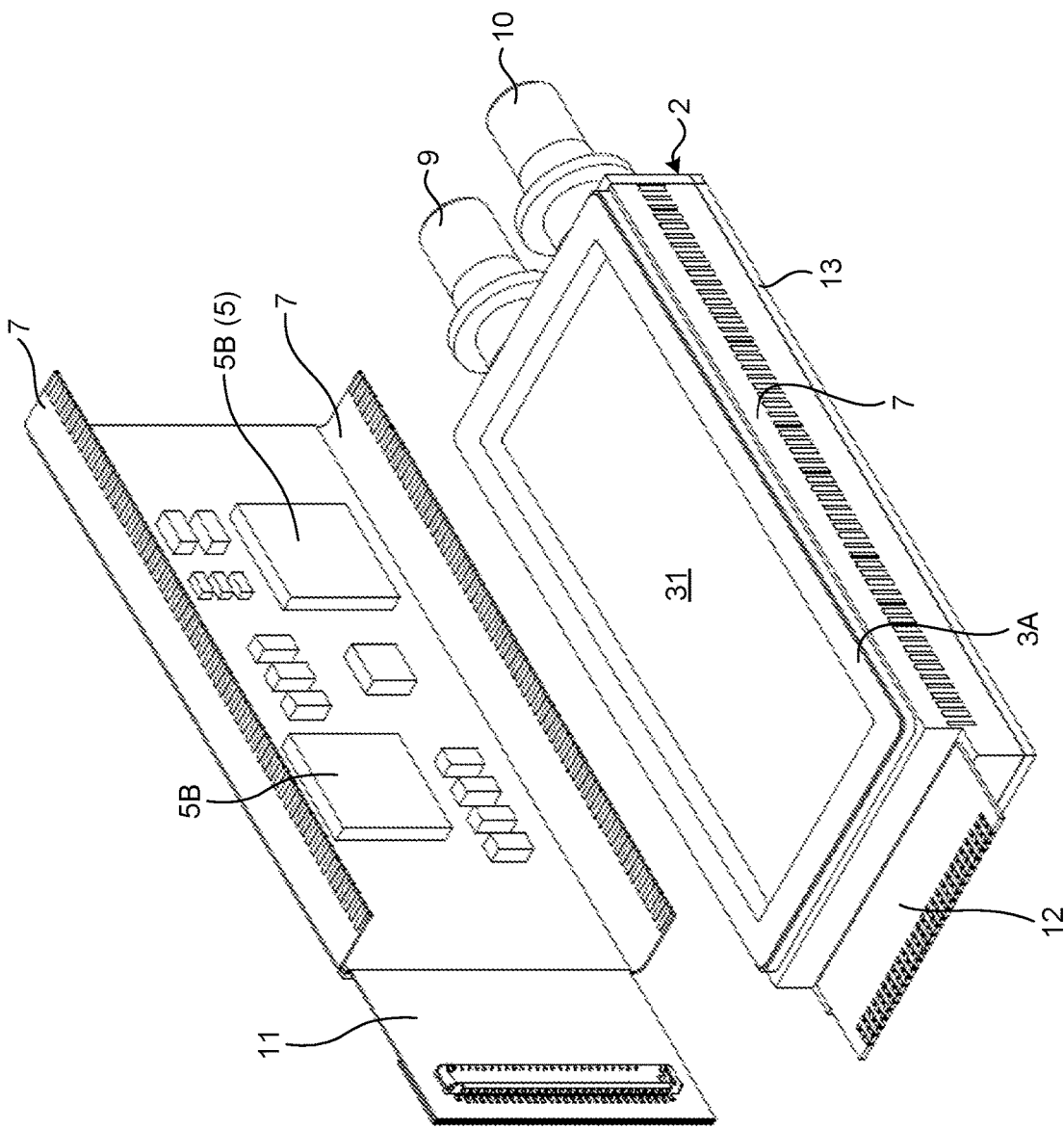
FIG. 6 is an exploded perspective view illustrating an example of an optical module.
Figure 7:
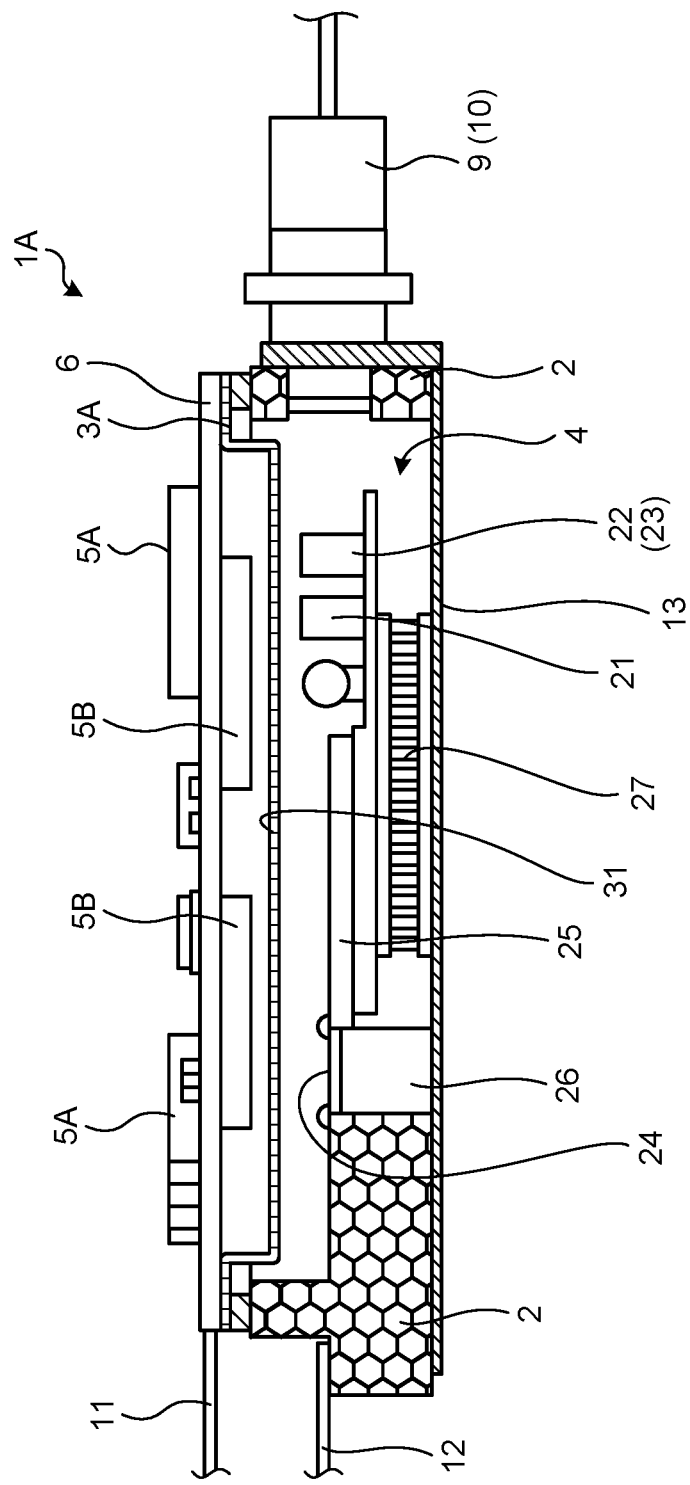
FIG. 7 is a cross-sectional view illustrating an example of an optical module.

FIG. 5 is an exploded perspective view illustrating an example of an optical module 1A of the second embodiment. FIG. 6 is an exploded perspective view illustrating an example of the optical module 1A. FIG. 7 is a sectional view illustrating an example of the optical module LA. The control circuit 5 illustrated in FIGS. 5 to 7 includes a first control circuit 5A mounted on a front surface of the printed circuit board 6 and a second control circuit 5B mounted on a back surface of the printed circuit board 6. The printed circuit board 6 is a double-sided board on which the first control circuit 5A and the second control circuit 5B are mounted on either side. A lid 3A has a recess 31 formed on its front surface. The recess 31 is configured to house the second control circuit 5B in a case where the printed circuit board 6 is arranged on the front surface of the lid 3A.

The optical module 1A of the second embodiment has the recess 31 formed on the front surface of the lid 3A. In a case where the printed circuit board 6 on either side of which the first control circuit 5A and the second control circuit 5B are mounted is arranged on the front surface of the lid 3A, the second control circuit 5B is housed in the recess 31. As a result, it is possible to support the double-sided printed circuit board 6, leading to further expansion of the circuit mounting area, and achievement of higher degree of freedom in circuit design. In addition, with a configuration of arranging components on the lid 3A side, it is possible to ensure a heat dissipation surface, facilitating formation of the heat sink structure.

The illustrated components in each of portions need not be physically configured as illustrated. That is, specific forms of distribution and integration for each of portions are not limited to the illustrated forms, but all or part of the portions may be configured to be physically or functionally distributed or integrated in any unit to be suitable for various loads and condition of use.

According to one aspect, it is possible to miniaturize the optical module by integrating the optical component and the control circuit.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical module comprising:
a housing;
a lid that closes an opening of the housing;
an optical component arranged in the opening of the housing;
a printed circuit board that is arranged on a front surface of the lid outside the housing when the lid closes the opening, and on which a control circuit that controls the optical component is mounted;
a side electrode provided on a side surface of the housing and electrically connected to an electrode of the optical component; and
a flexible substrate that provides electrical connection between the side electrode and an electrode of the control circuit;
wherein the optical module inside the housing is arranged below the lid and the control circuit outside the housing is arranged above the lid, the optical module is a structure to electrically shield between the control circuit and the optical component by using the lid.

2. The optical module according to claim 1,
wherein the control circuit includes:
a first control circuit mounted on a front surface of the printed circuit board; and
a second control circuit mounted on a back surface of the printed circuit board, and
the printed circuit board is arranged on the front surface of the lid so that the second control circuit is housed in a recess formed on the front surface of the lid.

3. The optical module according to claim 1,
wherein the optical component includes:
a light source that emits an optical signal; an optical transmission circuit that transmits an first signal using the optical signal from the light source; and an optical reception circuit that receives a second signal using the optical signal from the light source.

4. The optical module according to claim 1, wherein the optical component is hermetically sealed inside the housing by using the lid.

5. The optical module according to claim 1,
wherein the lid is
formed of a metal material.

6. The optical module according to claim 1,
wherein the lid is
formed of a material that blocks electrical noise.

7. The optical module according to claim 1, wherein the flexible substrate and the side electrode are electrically connected by an anisotropic conductive adhesive.

* * * * *